(12) United States Patent
Vanhoutte et al.

(10) Patent No.: US 6,902,097 B2
(45) Date of Patent: *Jun. 7, 2005

(54) ELECTRICALLY CONDUCTIVE WIRE

(75) Inventors: Eddy W. Vanhoutte, Bruges (BE); Gilbert De Clercq, Bruges (BE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 10/817,824

(22) Filed: Apr. 6, 2004

(65) Prior Publication Data

US 2004/0188498 A1 Sep. 30, 2004

Related U.S. Application Data

(62) Division of application No. 10/011,741, filed on Dec. 11, 2001, now Pat. No. 6,752,310, which is a division of application No. 08/752,865, filed on Nov. 20, 1996, now Pat. No. 6,410,854.

(30) Foreign Application Priority Data

Nov. 20, 1995 (EP) .............................. 95203166

(51) Int. Cl.$^7$ .......................... B23K 31/02; B23K 1/20; B23K 35/12; H05K 1/11
(52) U.S. Cl. .............................. 228/180.1; 228/180.22; 228/207; 228/223; 228/224; 174/94 R; 174/263
(58) Field of Search .................. 228/180.5, 180.22, 228/260, 180.1, 207, 223, 224; 174/94 R, 257, 259, 263

(56) References Cited

U.S. PATENT DOCUMENTS

| | | | |
|---|---|---|---|
| 2,258,750 A | | 10/1941 | Eichwald |
| 3,541,225 A | | 11/1970 | Raciti |
| 3,616,981 A | * | 11/1971 | Dieteman et al. ............ 228/3.1 |
| 3,693,052 A | | 9/1972 | Galanti |
| 3,770,874 A | | 11/1973 | Krieger et al. |
| 3,889,364 A | | 6/1975 | Krueger |
| 3,925,596 A | | 12/1975 | Siden |
| 4,592,137 A | | 6/1986 | Tanaka et al. |
| 4,809,901 A | * | 3/1989 | Gen et al. .................. 228/56.3 |
| 5,093,545 A | * | 3/1992 | McGaffigan ................ 219/616 |
| 5,110,034 A | | 5/1992 | Simmonds |
| 5,298,877 A | | 3/1994 | Gurevich et al. |
| 5,328,087 A | | 7/1994 | Nelson et al. |
| 5,427,865 A | | 6/1995 | Mullen, III et al. |
| 6,410,854 B1 | * | 6/2002 | Vanhoutte et al. ........ 174/94 R |
| 6,752,310 B2 | * | 6/2004 | Vanhoutte et al. .......... 228/260 |

FOREIGN PATENT DOCUMENTS

| | | |
|---|---|---|
| CA | 1052475 | 4/1979 |
| EP | 0 126 164 | 11/1984 |
| FR | 1387555 | 12/1964 |
| JP | 04-127547 | 4/1992 |

* cited by examiner

*Primary Examiner*—Lynne R. Edmondson

(57) ABSTRACT

A method of soldering comprises disposing first and second balls of solder adjacent one another on a wire; disposing flux on the wire between and in contact with both of the first and second balls and so as to substantially fill a space between the first and second balls; disposing the wire on a substrate so that the first and second balls of solder contact a single conductor on the substrate; and melting the first and second balls of solder and flux and soldering the wire to the conductor.

6 Claims, 1 Drawing Sheet

ELECTRICALLY CONDUCTIVE WIRE

This is a divisional of divisional application Ser. No. 10/011,741, filed Dec. 11, 2001 now U.S. Pat. No. 6,752,310 which is a divisional of application Ser. No. 08/752,865, filed Nov. 20, 1996 now U.S. Pat. No. 6,410,854. The entire disclosure of the above-referenced prior applications is considered as being part of the disclosure of the accompanying divisional application and is hereby incorporated by reference there in.

BACKGROUND OF THE INVENTION

The invention relates to an electrically conductive wire having a solder ball thereon for making a circuit connection between electrically conductive members on opposite surfaces of a substrate by means of a soldering process.

SUMMARY OF THE INVENTION

For circuit connection across both surfaces of a substrate, a through-hole substrate is known from EP-A-O 126 164. For making the circuit connection an electrically conductive wire having a solder ball thereon is used. The wire is inserted in the through-hole of the substrate. The substrate has electrically conductive members on both surfaces and the conductive members are arranged on the perimeters of the through-hole. The solder ball on the wire is positioned on one of the conductive members. By means of a soldering process, like dipping or flow soldering, one or both ends of the wire are soldered to a conductive member at one surface of the substrate, whereas at the same time heat generated during the soldering process is transferred through the wire to the solder ball at the opposite surface of the substrate in order to melt the solder ball for making a soldering connection between the wire and the conductive member at the opposite surface of the substrate. In this way the circuit connection between the conductive members on both surfaces of the substrate is made.

In practice it has turned out that to make a circuit connection with the use of a single solder ball on it as described hereinbefore, often leads to a bad connection between the conductive members.

Therefore many manufacturers use a separate soldering robot for making such circuit connections. However, this method is rather expensive and results in a limitation in design, logistics, maintenance and process control.

The object of the invention is to provide an electrically conductive wire means for making a reliable circuit connection between electrically conductive members on opposite surfaces of a substrate.

The present invention provides an electrically conductive wire having a solder ball thereon for making a circuit connection between electrically conductive members on opposite surfaces of a substrate, characterized in that the wire comprises two spaced apart solder balls on it and flux in the space between the solder balls.

Using this kind of wires for making circuit connections across both surfaces of a substrate results in a good and reliable connection. The wires are very suitable for use in an automatic soldering process, like reflow or wave soldering. The wire can be inserted in the through-hole of a substrate during the process of placing other components with the same machine. In one of the subsequent operation steps the components are soldered at their required position. At the same time the wires can be soldered in the same soldering process. So, the most important advantage is that the wires can be soldered during existing automatic soldering processes of other components. Preferably the solder balls are composed of tin, lead and bismuth instead of tin and lead only as usually used. The addition of bismuth reduces the melting temperature of the solder.

BRIEF DESCRIPTION OF THE DRAWINGS

The present invention will now be described, by way of example, with reference to the accompanying drawings, wherein.

DETAILED DESCRIPTION OF THE PREFERRED EMBODIMENTS

Figure 1:
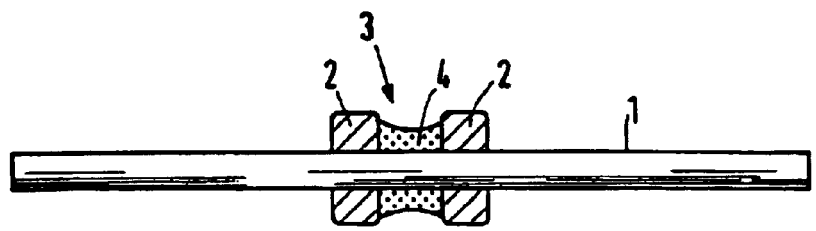
FIG. 1 shows the conductive wire.
Figure 2:
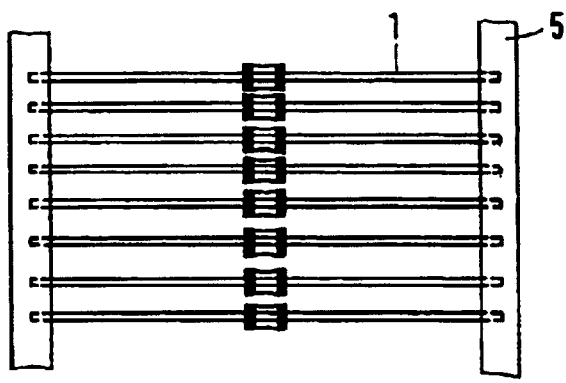
FIG. 2 shows the wires packed in a tape.
Figure 3:
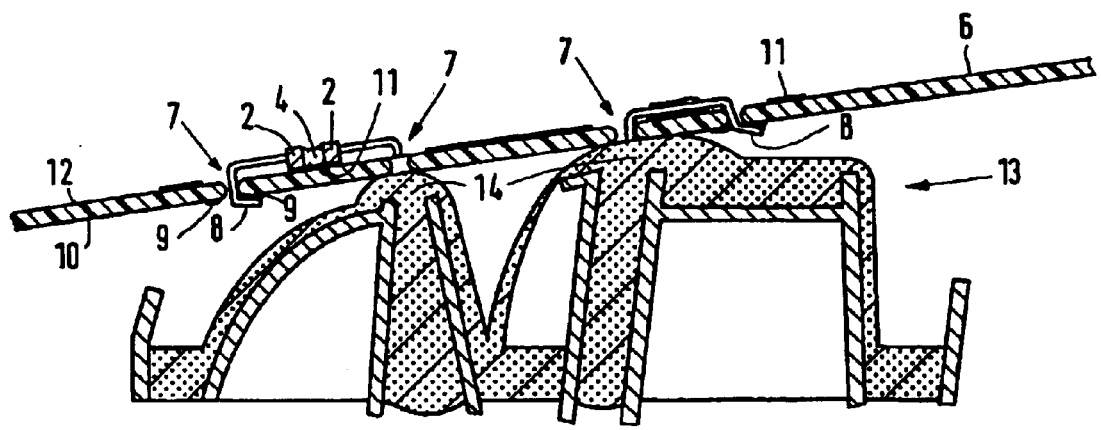
FIG. 3 shows schematically a wave soldering process for a substrate with inserted conductive wires.

The electrically conductive wire 1, usually a copper wire, is provided with two solder balls or dots 2 fixedly secured thereon. The solder balls are spaced apart. The small space 3 between the balls are filled with a flux 4. The wires can be packed in a tape 5 in well known manner (see FIG. 2) for use in a feeder of, for example, a component placement machine. In a component placement machine the wires are inserted in through-holes 7 of a substrate 6 or printed circuit board in such a manner that the ends 8 of a wire make contact with or are close to a conductive track 9 provided on one of the surfaces 10 of the substrate and the solder balls 2 with flux 4 between them make contact with or are close to a conductive track 11 provided on the opposite surface 12 of the substrate. Usually other components are also placed on the substrate as well. For electrically connecting the wires and components, the substrate is transported through, for example, a wave soldering machine 13, as shown in FIG. 3. The surface 10 of the substrate faces the hot solder 14. The hot solder touches the ends 8 of the wire 1, which are then soldered to their respective conductive tracks 9. The heat of the hot solder 14 is also transferred through the wire 2 to the solder balls 2 situated at the opposite surface 12 of the substrate. The solder balls melt and the conductive track surfaces to be wetted by solder are cleaned by means of the flux, so that a reliable connection is obtained. By using a composition of solder with tin, lead and bismuth, such as Sn43PB43Bi14, the melting temperature is reduced, resulting in a better electrical connection.

What is claimed is:

1. A method of soldering comprising:

disposing first and second balls of solder adjacent one another on a wire;

disposing flux on the wire between and in contact with both of the first and second balls and so as to substantially fill a space between the first and second balls;

disposing the wire on a substrate so that the first and second balls of solder contact a single conductor on the substrate; and melting the first and second balls of solder and flux and soldering the wire to the conductor.

2. A method as set forth in claim 1, wherein the melting is achieved using a wave soldering machine.

3. A method of soldering comprising:

preparing a solderable assembly by:

fixing a first solder ball on a wire;

fixing a second solder ball fixed on the wire with such spacing between the first solder ball and the second solder ball that both of the solder balls can contact a single conductive contact; and fixing flux on the wire and forming a continuous layer substantially filling the space between the first and second solder balls.

4. A method as set forth in claim 3, further comprising:

deploying the solderable assembly so that the first and second solder balls are disposed on the single contact; and heating the solderable assembly so that the solder balls and flux flow and make a single reliable connection.

5. A method as set forth in claim 4, wherein heating the solderable assembly comprises heating the wire and conducting heat through the wire to the flux and the first and second balls of solder.

6. A method of soldering comprising:

preparing a solderable assembly by:

fixing a first solder ball on a wire;

fixing a second solder ball fixed on the wire with such spacing between the first solder ball and the second solder ball that both of the solder balls can contact a single conductive contact; and fixing flux on the wire and forming a continuous layer substantially filling the space between the first and second solder balls;

deploying the solderable assembly so that the first and second solder balls are disposed on the single contact;

heating the solderable assembly so that the solder balls and flux flow and make a single reliable connection;

disposing a portion of the wire through an aperture in a substrate heating wire which has passed through the aperture.

* * * * *